(12) United States Patent
Kim et al.

(10) Patent No.: US 8,334,536 B2
(45) Date of Patent: Dec. 18, 2012

(54) THIN FILM TRANSISTOR, ORGANIC LIGHT EMITTING DIODE DISPLAY DEVICE HAVING THE SAME, FLAT PANEL DISPLAY DEVICE, AND SEMICONDUCTOR DEVICE, AND METHODS OF FABRICATING THE SAME

(75) Inventors: Kyoung-Bo Kim, Suwon-si (KR); Kil-Won Lee, Suwon-si (KR); Jin-Wook Seo, Suwon-si (KR); Ki-Yong Lee, Suwon-si (KR); Moo-Jin Kim, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 595 days.

(21) Appl. No.: 12/048,662

(22) Filed: Mar. 14, 2008

(65) Prior Publication Data

US 2008/0224143 A1 Sep. 18, 2008

(30) Foreign Application Priority Data

Mar. 16, 2007 (KR) .................. 10-2007-0026202
Mar. 20, 2007 (KR) .................. 10-2007-0027141

(51) Int. Cl.
*H01L 29/04* (2006.01)
(52) U.S. Cl. ......................................... 257/59; 257/72
(58) Field of Classification Search .................. 257/40, 257/59, 72; 313/483, 500
See application file for complete search history.

(56) References Cited

U.S. PATENT DOCUMENTS

| 6,787,806 | B1* | 9/2004 | Yamazaki et al. ............... 257/64 |
| 2001/0012651 | A1* | 8/2001 | Yamazaki et al. ............... 438/166 |
| 2002/0153360 | A1* | 10/2002 | Yamazaki et al. ....... 219/121.66 |
| 2005/0082970 | A1* | 4/2005 | Yamazaki et al. ............. 313/506 |

FOREIGN PATENT DOCUMENTS

| JP | 6-268185 | 9/1994 |
| JP | 7-183536 | 7/1995 |
| JP | 8/339960 | 12/1996 |
| JP | 2000-299470 | 10/2000 |

(Continued)

OTHER PUBLICATIONS

U.S. Appl. No. 12/047,619, filed Mar. 13, 2008, Jong-Hyun Choi, Samsung SDI Co., LTD.

(Continued)

*Primary Examiner* — Anthony Ho
(74) *Attorney, Agent, or Firm* — H.C. Park & Associates, PLC

(57) ABSTRACT

A thin film transistor and a method of fabricating the same include: a semiconductor layer having a grain boundary disposed in a crystal growth direction and having a variation in height of a top surface of 15 nm or less formed by a thin beam directional crystallization method. Also, an organic light emitting diode (OLED) display device comprising the thin film transistor is provided and has excellent characteristics fabricated by a simple process. Also, a flat panel display device and a method of fabricating the same are provided and include: a polycrystalline silicon layer in a pixel region; and a polycrystalline silicon layer in a peripheral region formed by the thin beam directional crystallization method. Also, a semiconductor device and a method of fabricating the same include: an intrinsic region of a semiconductor layer in the photodiode region formed by the thin beam directional crystallization method.

8 Claims, 18 Drawing Sheets

FOREIGN PATENT DOCUMENTS

| | | |
|---|---|---|
| JP | 2001-326363 | 11/2001 |
| KR | 2001-66251 | 7/2001 |
| KR | 2002-56239 | 7/2002 |
| KR | 2003-14885 | 2/2003 |
| KR | 2006-1711 | 1/2006 |
| KR | 2006-12850 | 2/2006 |
| KR | 2006-17424 | 2/2006 |

OTHER PUBLICATIONS

Notice of Allowance issued in Korean Patent Application No. 2007-26202 on Jul. 29, 2008.

Notice of Allowance issued in Korean Patent Application No. 2007-27141 on Jul. 29, 2008.

* cited by examiner

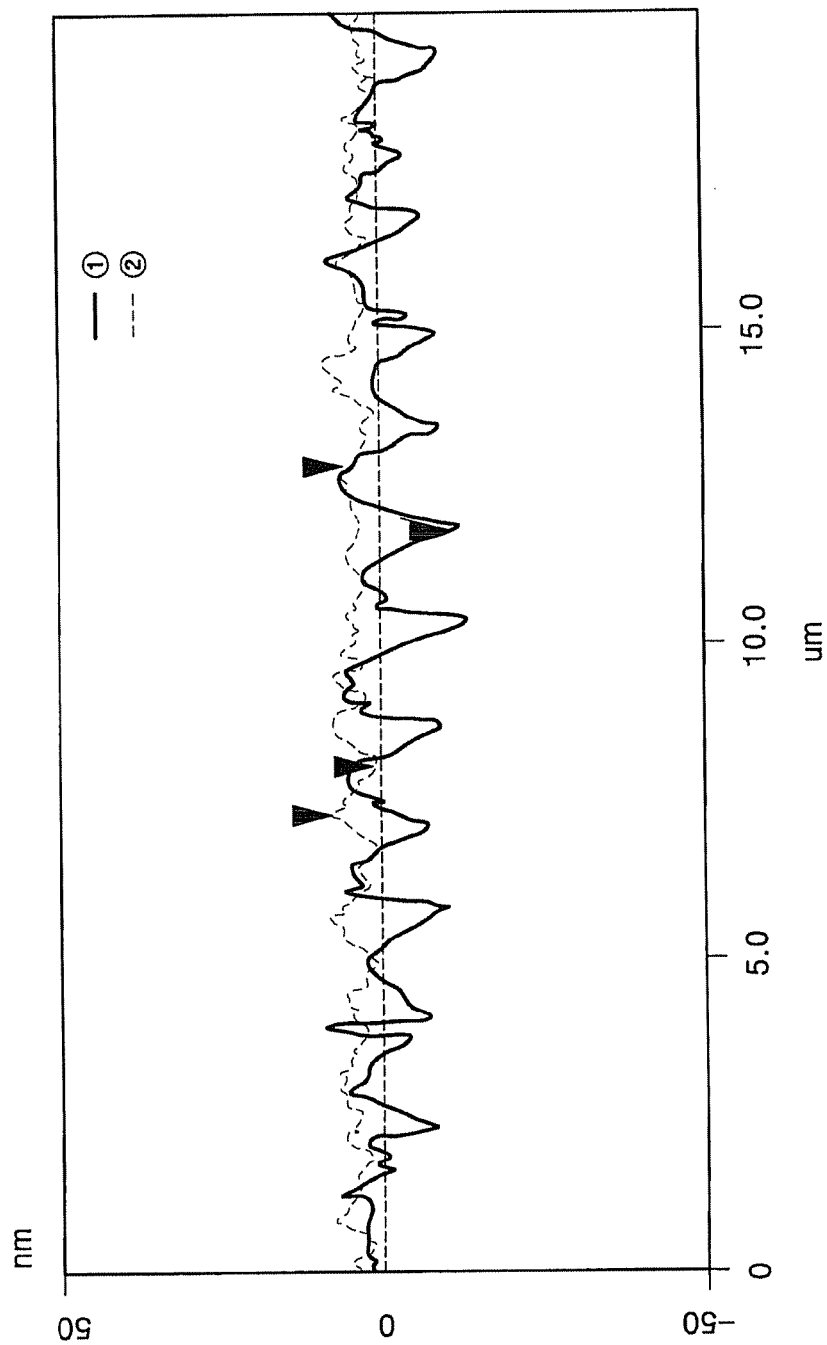

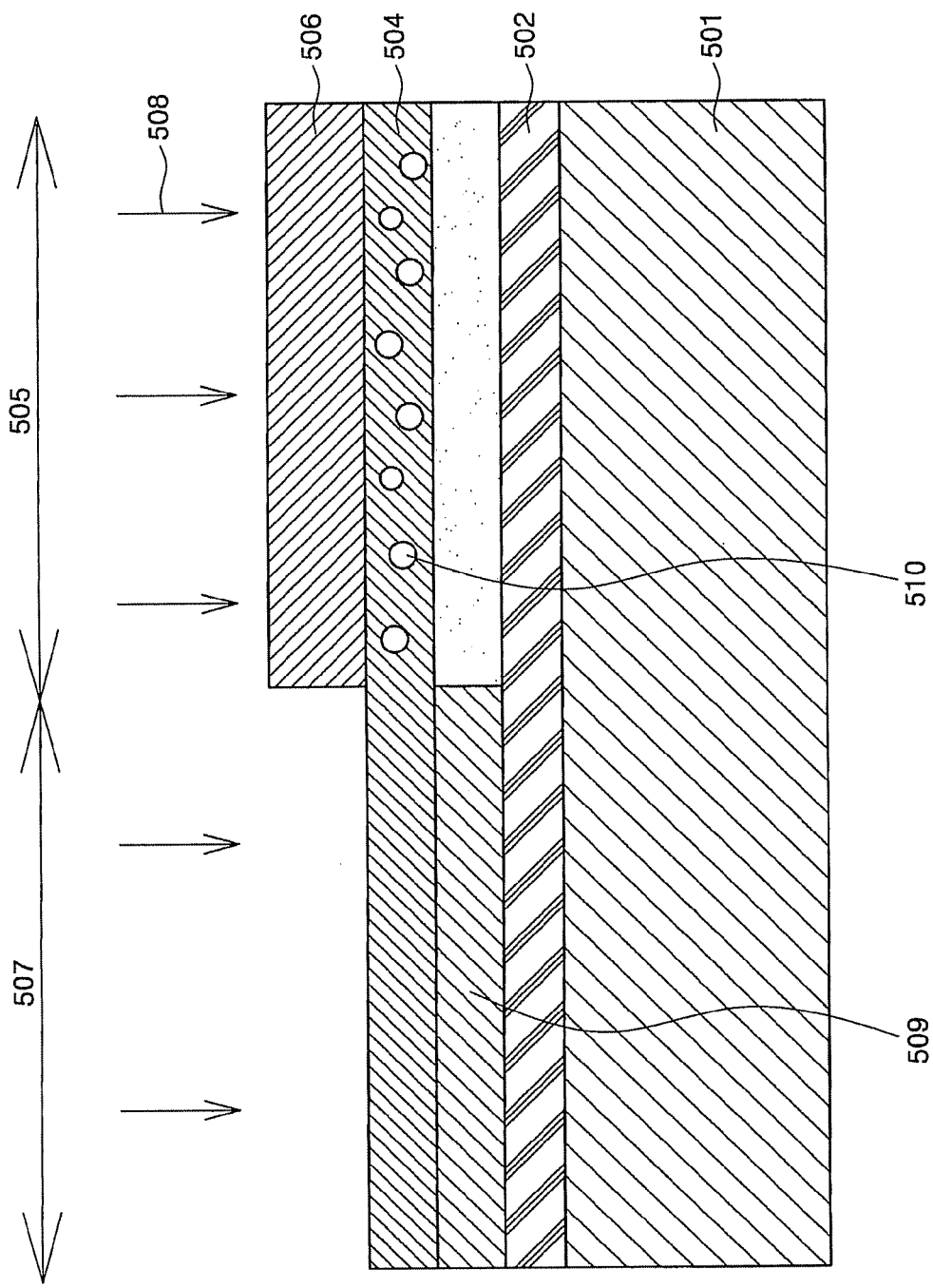

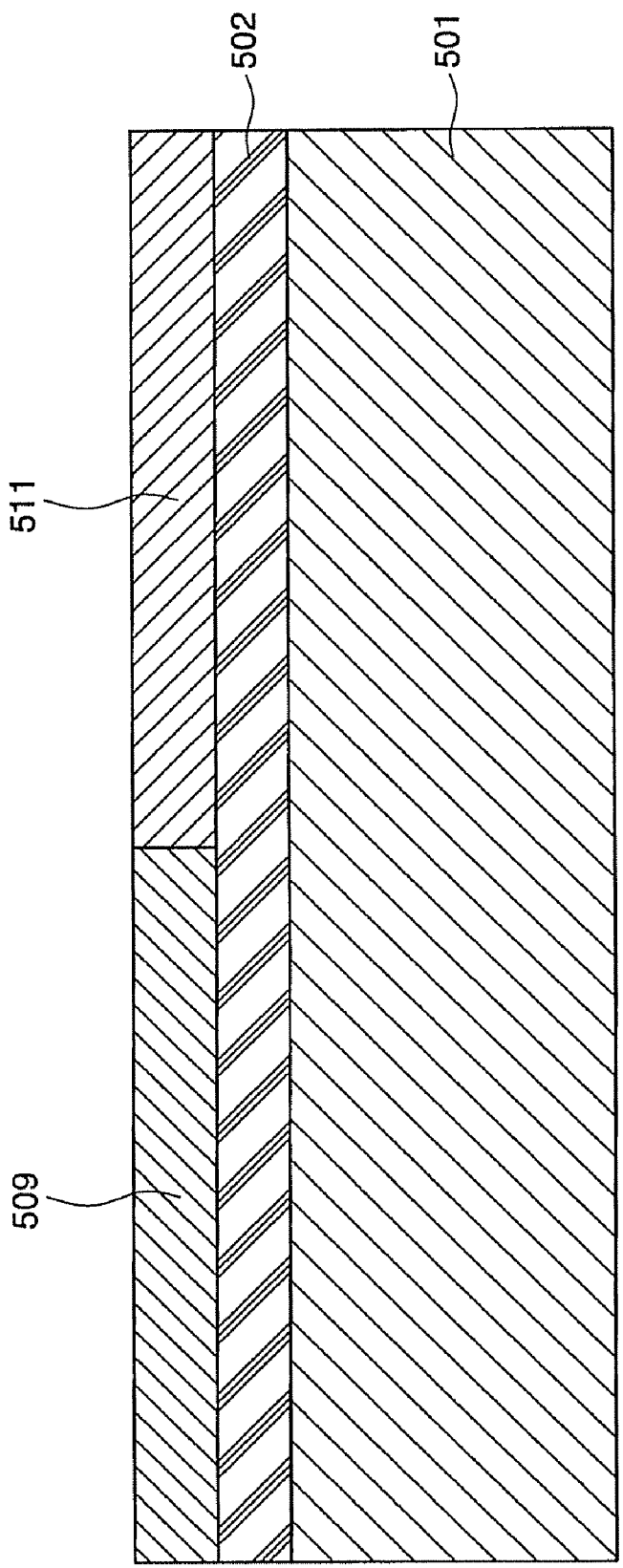

THIN FILM TRANSISTOR, ORGANIC LIGHT EMITTING DIODE DISPLAY DEVICE HAVING THE SAME, FLAT PANEL DISPLAY DEVICE, AND SEMICONDUCTOR DEVICE, AND METHODS OF FABRICATING THE SAME

CROSS-REFERENCE TO RELATED APPLICATION

This application claims the benefit of Korean Application No. 2007-26202 filed Mar. 16, 2007 and Korean Application No. 2007-27141 filed Mar. 20, 2007, the disclosures of which are incorporated herein by reference.

BACKGROUND OF THE INVENTION

1. Field of the Invention

Aspects of the present invention relate to a directional crystallization method of directly irradiating a laser beam having a specific width and length on amorphous silicon to crystallize the amorphous silicon, and more particularly, to a method of crystallizing amorphous silicon into polycrystalline silicon having a grain boundary parallel to a crystal growth direction without using a mask and having excellent surface roughness, a method of fabricating a thin film transistor using the same, and an organic light emitting diode (OLED) display device including the thin film transistor.

Aspects of the present invention also relate to a flat panel display in which a directional crystallization method and a super grained silicon (SGS) crystallization method are used to crystallize an amorphous silicon layer and a method of fabricating the same, and a semiconductor device and a method of fabricating the same. More particularly, aspects of the present invention relate to a flat panel display device having excellent characteristics, which includes a thin film transistor simultaneously having high electron mobility and uniformity of characteristics by forming semiconductor layers in peripheral and pixel regions using directional crystallization using a laser and SGS crystallization, respectively, a semiconductor device, and methods of fabricating the same.

2. Description of the Related Art

Generally, polycrystalline silicon layers are widely used as semiconductor layers for thin film transistors because they have high field effect mobility, and can be applied to high-speed operation circuits and constitute CMOS circuits. The thin film transistors using these polycrystalline silicon layers are usually applied to active devices of active-matrix liquid crystal display (AMLCD) devices and switching and driving devices of OLED display devices.

Methods of crystallizing the amorphous silicon layer into the polycrystalline silicon layer include solid phase crystallization (SPC), metal induced crystallization (MIC), metal induced lateral crystallization (MILC), excimer laser crystallization (ELC), and sequential lateral solidification (SLS).

Among these, a method of crystallizing using a laser can be performed at a low temperature, and thus, low temperature polycrystalline silicon (LTPS) may be fabricated.

Excimer laser annealing (ELA) is used to fabricate a thin film transistor using such a low temperature polycrystalline silicon layer. In ELA, amorphous silicon is melted and crystallized for a short time of 30 to 200 ns, and thus, ELA does not damage a glass substrate. The actual duration is only several hundred nanoseconds per pulse, and ELA can be used at room temperature. ELA uses multiple pulses applied in a length of 15 to 30 cm and a width of 0.2 to 3 mm. A beam profile of a laser, the number of pulses, initial substrate temperature, and a deposition condition and method of an amorphous silicon layer are critical factors which affect the final crystallinity of the resulting polycrystalline silicon layer.

Recently, flat panel display devices, such as a liquid crystal display (LCD) device, an organic light emitting diode (OLED) display device, or a plasma display panel (PDP), have attracted attention as such resolve disadvantages of conventional, heavy, and large display devices, such as a cathode ray tube. In the flat panel display device, such as the OLED display device or the LCD device, a thin film transistor is widely used as a switching device, and a semiconductor layer of the thin film transistor is formed of polycrystalline silicon.

The polycrystalline silicon layer may be formed by as-deposition, which is a method of directly depositing a polycrystalline silicon layer on a glass substrate at a temperature of 580° C. or more and under a pressure of 0.1 to 0.2 torr. However, in such a method, common glass substrates cannot endure such a high temperature for the time necessary for crystallization of the silicon layer, and thus a large glass panel cannot be used. It is noted that the method has been successful at 530° C. using silane ($SiH_4$) gas, which, however, is difficult to commercialize.

Second, to form the polycrystalline silicon layer, a solid phase crystallization (SPC) method may be used, which is the most direct and oldest method for obtaining a polycrystalline silicon thin film from amorphous silicon. In the SPC method, silicon ions are injected into a deposited amorphous silicon layer, and then annealed at 600° C. or less for at least several tens of hours. The size of the final grains depends on a dose of injected silicon ions, annealing temperature, and annealing time. The polycrystalline silicon layer obtained by such SPC method generally has several μm grains, which is relatively large, but also has many defects in a corresponding grain. Such defects are known to negatively affect performance of the resulting thin film transistor.

Third, to form the polycrystalline silicon layer, a rapid thermal annealing (RTA) method may be used, which has high mass-productivity and is performed at a temperature of 700 to 1100° C. for several seconds. Fewer defects in the grain are generated than with the SPC method, but deformation of or damage to the substrate during annealing is a decisive problem. Though the annealing time is short, fine contraction or swelling of a panel or circuit results in a misalignment margin of a pattern, and thus the process becomes impossible. Recently, such an RTA process is widely used as a dehydrogenation process of removing hydrogen atoms after depositing an amorphous silicon layer using a plasma enhanced chemical vapor deposition (PECVD) method or a process of activating ions after ion injection rather than a process of crystallizing an amorphous silicon layer.

Like ELA above, there is a sequential lateral solidification (SLS) method of crystallization using a mask. However, the SLS has disadvantages of being a complicated process and costly because a primary grain boundary interrupting current flow is formed and the laser is irradiated using a mask in growing the crystals.

However, although the above-described crystallization methods have advantages and disadvantages, there is no method that produces a polycrystalline layer simultaneously having high electron mobility in a peripheral region and uniformity in a pixel region, which are needed in an organic light emitting diode (OLED) display device.

In the SLS process, silicon crystalline particles may be laterally grown to a predetermined length by appropriately controlling an intensity of laser energy, an irradiation range of a laser beam, and a translation distance, thereby crystallizing amorphous silicon into a single crystalline level. An irradiation device used in the SLS process concentrates the beam in a small region using a mask such that an amorphous silicon layer stacked on a large substrate may not be simultaneously converted into a polycrystalline state. Thus, to irradiate the laser beam on the entire region of the substrate, after the substrate on which the amorphous silicon layer is stacked is located on a stage, the laser beam is applied to an area, and then the substrate moves to apply the laser beam to another area. However, the "primary grain boundary" and "secondary grain boundary" formed by the SLS process affect electrical characteristics of a resulting thin film transistor, and thus variations of characteristics occur in the thin film transistor using polycrystalline silicon having such grain boundaries.

Also, when the crystallization is performed by controlling a translation range of the laser beam irradiated to remove the "primary grain boundary" to less than ½ of the laser beam width, new grain boundaries are formed by collision or division of the grains as the grains grow. The new grain boundary is irregularly formed so that the overall grain boundaries are non-uniform. Such non-uniformity of the grain boundary affects the electrical characteristics of the thin film transistor to cause variations in the characteristics of the thin film transistor, and thus defects are generated by the concentration of an electric field at a protrusion created due to the non-uniform primary grain boundary, and a mura phenomenon occurs. Also, the use of a mask makes the process more complicated and expensive.

SUMMARY OF THE INVENTION

Aspects of the present invention provide a method of crystallizing amorphous silicon into polycrystalline silicon having large grains and an even surface using a laser beam having a small irradiation width, thereby improving device performance and ensuring process or equipment margin. Also, aspects of the present invention provide a flat panel display device having excellent characteristics, which has a thin film transistor simultaneously satisfying high electron mobility and uniformity by forming a semiconductor layer having high electron mobility and crystallizing the semiconductor layer in a pixel region requiring uniform characteristics of the semiconductor layer by an SGS crystallization method, a semiconductor device, and methods of fabricating the same.

According to an aspect of the present invention, a thin film transistor and a method of fabricating the same are provided, the thin film transistor including: a substrate; a semiconductor layer formed of polycrystalline silicon on the substrate, the semiconductor layer having a grain boundary disposed in a crystal growth direction and having a variation in height of a top surface of 15 nm or less; a gate electrode formed to correspond to a part of the semiconductor layer; a gate insulating layer to insulate the gate electrode from the semiconductor layer; and source and drain electrodes connected to the semiconductor layer.

According to another aspect of the present invention, a flat panel display device and a method of fabricating the same are provided, the flat panel display device including: a substrate having a pixel region and a peripheral region; a buffer layer disposed on the substrate; a polycrystalline silicon layer in the pixel region disposed on the buffer layer and including metal catalyst particles at a concentration of $10^{13}$ atoms/cm$^3$ or less; a polycrystalline silicon layer in the peripheral region disposed on the buffer layer, the polycrystalline silicon layer having a grain boundary disposed in a crystal growth direction and having a variation in height of a top surface of 15 nm or less; gate electrodes formed to correspond to parts of the polycrystalline silicon layers in the pixel and peripheral regions, respectively; a gate insulating layer to insulate the polycrystalline silicon layer from the gate electrode; source and drain electrodes connected with parts of the polycrystalline silicon layers in the pixel and peripheral regions; and a first electrode, an organic emitting layer, and a second electrode disposed in the pixel region.

According to still another aspect of the present invention, a semiconductor device and a method of fabricating the same, the semiconductor device including: a substrate having a thin film transistor region and a photodiode region; a buffer layer disposed on the substrate; a semiconductor layer of the thin film transistor region disposed on the buffer layer and having metal catalyst particles at a concentration of $10^{13}$ atoms/cm$^3$ or less; and a semiconductor layer of the photodiode region disposed on the buffer layer, the semiconductor layer having a grain boundary disposed in a crystal growth direction and having a variation in height of a top surface of 15 nm or less; a gate electrode, an interlayer insulating layer, and source and drain electrodes connected to the semiconductor layer in the thin film transistor region; and interconnections connected to a photodiode electrode in the photodiode region.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 2B is a photograph of crystallized amorphous silicon;

FIGS. 5 to 10B illustrate a process of fabricating a flat panel display device according to aspects of the present invention.

DETAILED DESCRIPTION OF THE EMBODIMENTS

Figure 1:
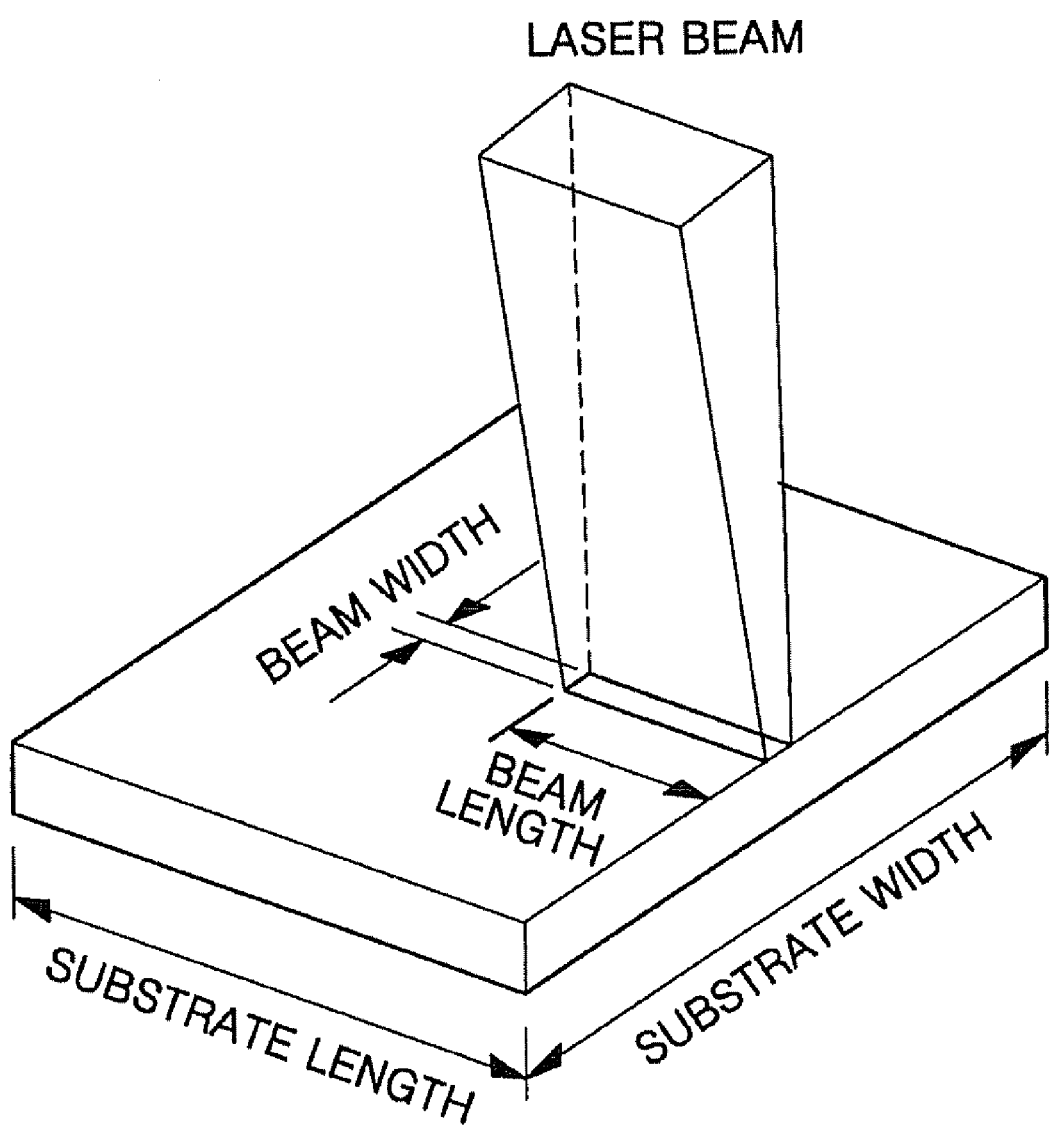
FIG. 1 illustrates a laser irradiation device used in silicon crystallization according to aspects of the present invention.

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures. It will be understood that when an element or layer is referred to as being "disposed on" or "formed on" another element or layer, it may be directly disposed or formed on the other element or layer, or intervening elements or layers may be present. Other words used to describe the relationship between elements should be interpreted in a like fashion (e.g., "between" versus "directly between", "adjacent" versus "directly adjacent", etc.).

Figure 2A:
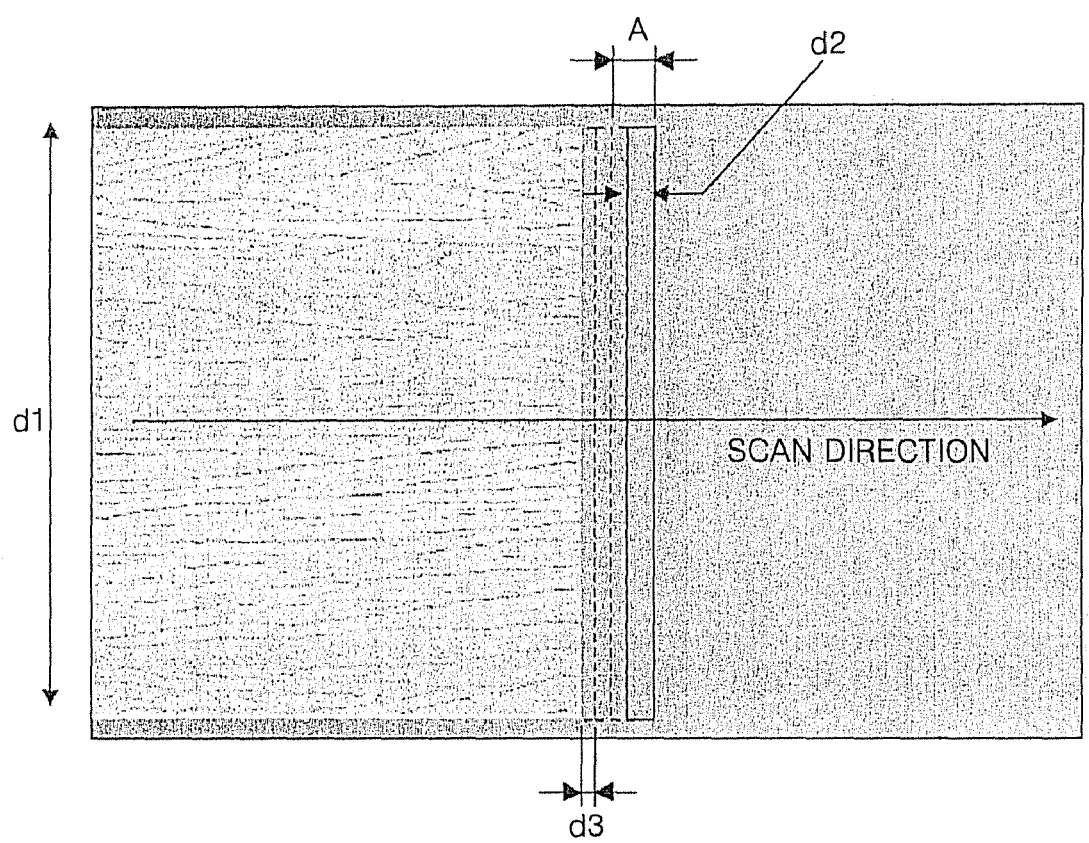
FIG. 2A is a plan view of an amorphous silicon layer on which a laser beam is irradiated by the laser irradiation device of FIG. 1.

FIG. 1 illustrates a laser irradiation device used in silicon crystallization, and FIG. 2A illustrates a crystallization process using the laser irradiation device of FIG. 1. Referring to FIGS. 1 and 2A, the silicon crystallization according to aspects of the present invention allows an amorphous silicon layer to be crystallized by directly irradiating a laser beam thereon without using a mask, unlike sequential lateral solidification (SLS), and thus is called a thin beam directional crystallization method.

First referring to FIG. 1, the laser beam is irradiated at 600 to 1000 W, and provided for a time in a pulse form. Here, the laser is one of KrF or XeF. The laser beam has a very small pitch of irradiation interval since the laser beam is irradiated with a small width and a length in a pulse form without using a mask. Also, an upper area of the irradiated laser beam is larger than an irradiation area such that the laser beam is concentrated at the irradiation area.

Referring to FIG. 2A, aspects of the present invention use a laser beam having a length d1 of 365 to 1100 nm and a width d2 of 5 to 20 μm to melt and solidify the amorphous silicon. In contrast, ELA uses a laser beam having a width of 400 μm. Accordingly, the laser beam used in the thin beam directional crystallization method is thinner and longer than that used in ELA.

As the laser beam has an intensity to instantly melt amorphous silicon. The energy of the laser beam may be at a complete melting region energy to form a complete melting region in the amorphous silicon layer or at a near-complete melting region energy to form a complete melting neighboring region on a side of the amorphous silicon layer. Here, the laser beam may have an energy density of 150 to 1000 mJ/cm$^2$ and may have enough intensity to completely melt the amorphous silicon.

Aspects of the present invention remove a primary grain boundary, which may be disposed perpendicular to a crystal growth direction to interrupt electrical flow when using a semiconductor layer, which is a disadvantage of SLS. Also, in the crystallization using the laser beam according to aspects of the present invention, a mask is not used, and thus the process is simpler and less expensive than the conventional crystallization using a laser beam.

According to aspects of the present invention, after the first laser irradiation, a primary grain boundary may be formed. However, a secondary laser irradiation is performed to melt the amorphous silicon and polycrystalline silicon at a region A, as shown in FIG. 2A, comprising the boundary of the polycrystalline silicon region having the grains and the amorphous silicon, and then the silicon is cooled, and thus atoms are stuck to the previously formed polycrystalline grains, which are not dissolved by the secondary laser irradiation, and the grain length increases at one side. As a result, only the grain boundaries parallel to the crystal growth direction remain. Here, the laser beam may have a translation distance d3, i.e., a pitch of 1 to 3 μm, and is continuously irradiated in a pulse form. A protrusion may be formed due to a volume difference while the amorphous silicon layer is melted and then solidified and a grain boundary is formed perpendicular to the crystal growth direction, and such a grain boundary is melted and crystallized again.

Accordingly, in consideration that the laser beam according to aspects of the present invention has a width of 5 to 20 μm, the laser irradiation pitch is less than the width of the laser beam, for example 3 μm, to melt the grain boundaries again, comprising those grain boundaries perpendicular to the crystal growth direction. Also, since the laser beam is translated, the pitch is generally more than 1 μm.

As such, the laser beam is irradiated on the amorphous silicon, and thus the grain may keep laterally growing and become larger. Also, the protrusion formed by the volume difference caused by the repetitive melting and solidification of the amorphous silicon in a small pitch interval may be prevented, thereby preventing defects caused by an electrical field being concentrated at the protruding parts. The irradiating of the laser beam according to aspects of the present invention results in a surface roughness, or variation in height of a top surface, of the polycrystalline silicon layer of 15 nm or less so as to allow smooth movement of charges therein.

FIG. 2B is a graph showing surface roughness of a crystallized polycrystalline silicon layer according to aspects of the present invention. Graph (1) in FIG. 2B illustrates a horizontal direction of the polycrystalline silicon layer (a laser irradiation direction), and Graph (2) in FIG. 2B illustrates a roughness of the polycrystalline silicon layer in a vertical direction (a direction perpendicular to the laser irradiation direction). Referring to FIG. 2B, a difference between peaks is less than 15 nm. Thus, it may be noted that the surface of the crystallized polycrystalline silicon according to aspects of the present invention is quite even with few protrusions. Accordingly, a device in which the polycrystallized silicon is included does not have problems which may be caused by being formed of polycrystalline silicon having protrusions, and therefore, such device may have improved characteristics.

Figure 2C:
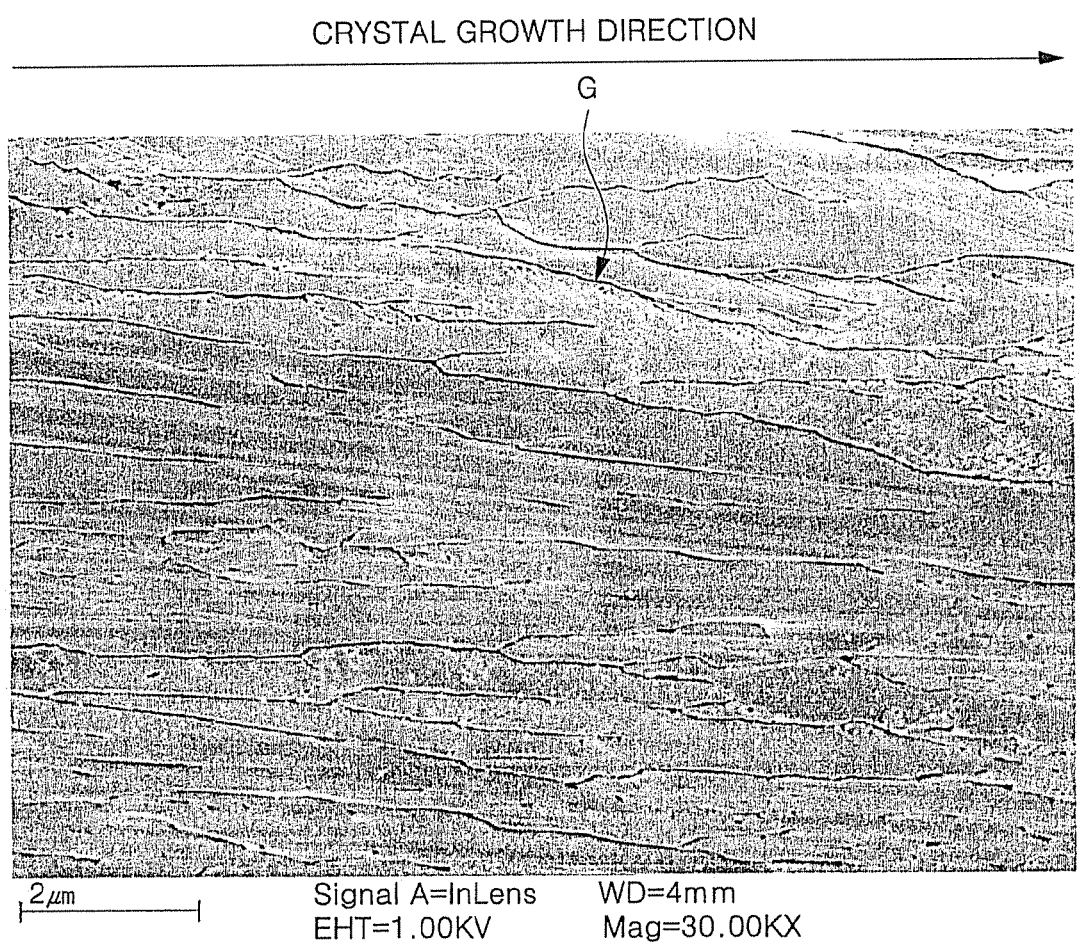
FIG. 2C is a graph illustrating surface roughness of a polycrystalline silicon layer crystallized according to aspects of the present invention.

FIG. 2C is a scanning electron microscope SEM photograph of an amorphous silicon crystallized by an exemplary embodiment of the present invention. Referring to FIG. 2C, the polycrystalline silicon crystallized according to aspects of the present invention has only a grain boundary G formed parallel to a crystal growth direction, and the crystals are very large. Since there are no primary grain boundaries, i.e., grain boundaries formed perpendicular to the crystal growth direction, which are formed in the conventional laser crystallization method as described above, electrical characteristics of a thin film transistor are not affected so that the polycrystalline silicon according to aspects of the present invention can have excellent crystallinity, and a thin film transistor having excellent characteristics can be produced.

Consequently, a polycrystalline silicon layer formed by a thin beam directional crystallization method using a laser according to aspects of the present invention has large grains and few protrusions. Further, the polycrystalline silicon layer formed by the thin beam directional crystallization method has no grain boundaries formed perpendicular to the crystal growth direction to interrupt current flow, i.e., has no primary grain boundaries, so it has excellent current characteristics when applied to a device. Also, since the process can be performed using only a low-level energy laser without a mask, the process becomes simpler and less expensive.

Figure 3:
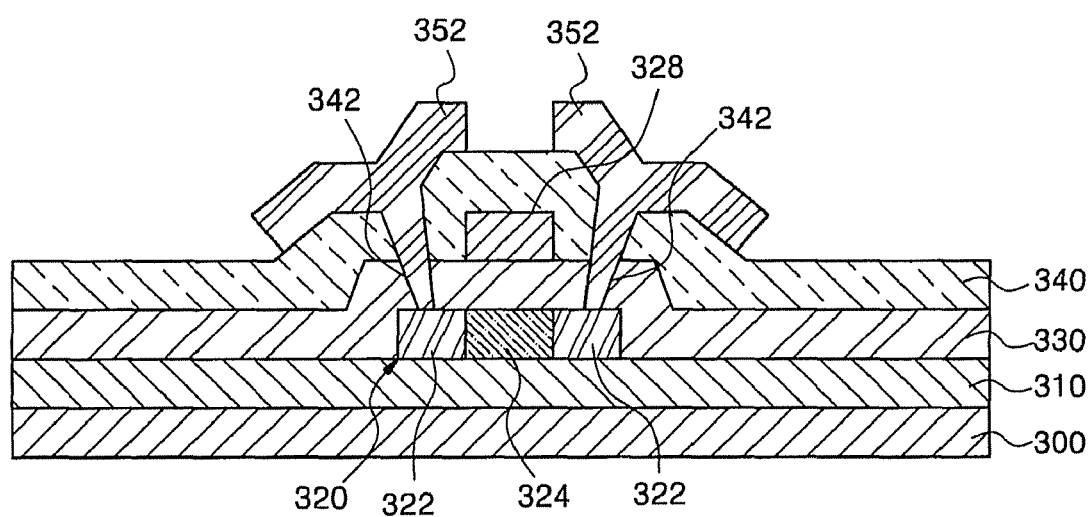
FIG. 3 illustrates a thin film transistor according to aspects of the present invention.

FIG. 3 illustrates a thin film transistor according to a first exemplary embodiment of the present invention. Referring to FIG. 3, a buffer layer 310 and an amorphous silicon layer are sequentially formed on a substrate 300. The buffer layer 310 serves to prevent diffusion of impurities in the substrate 300 during crystallization of the amorphous silicon layer to be performed later.

Subsequently, the amorphous silicon layer is crystallized into a polycrystalline silicon layer (not illustrated) by thin beam directional crystallization according to aspects of the present invention. The thin beam directional crystallization is a method of directly irradiating a laser beam having a specific width and length on the amorphous silicon layer without using a mask. According to aspects of the present invention, the intensity and the irradiation area of the laser beam are optimized to melt and solidify the amorphous silicon layer. The optimized laser beam has an energy density of 150 to 1000 mJ/cm$^2$, a length of 365 to 1100 nm, and a width of 5 to 20 μm. The laser directly moves a short translation distance as much as a pitch of 1 to 3 μm and is continuously irradiated in order to remove a primary grain boundary.

The thin beam directional crystallization melts and solidifies a portion of the amorphous silicon layer by first laser irradiation thereto without using a mask. After that, the laser is secondarily irradiated on an overlapping part, i.e., an already-crystallized portion of the amorphous silicon layer and an adjacent amorphous portion of the silicon layer are simultaneously irradiated, thereby growing crystal in the laser irradiation direction from the first laser irradiation to the second laser irradiation.

In order to not form primary grain boundaries perpendicular to the crystal growth direction, which exist in the conventional SLS process, while the crystallization by continuous laser irradiation is in progress, the laser is continuously irradiated in a pitch interval of 1 to 3 μm. Therefore, a uniform silicon layer having only secondary grain boundaries disposed parallel to the crystal growth direction is formed in the polycrystalline silicon layer crystallized by the thin beam directional crystallization according to aspects of the present invention. Also, since the polycrystalline silicon layer has very large grains, it can have excellent characteristics when applied to an electrical device, and when the polycrystalline silicon layer is used as a semiconductor layer, the grain boundaries may be formed parallel to the current flow.

The polycrystalline silicon layer formed as such is patterned, thereby forming a semiconductor layer 320 in a thin film transistor formation region. A gate insulating layer 330 is formed on the substrate 300 comprising the semiconductor layer 320. The gate insulating layer 330 may be formed of a silicon oxide layer (SiO$_2$), a silicon nitride layer (SiN$_x$), or a stack thereof.

Subsequently, a metal layer for a gate electrode (not illustrated) is formed, which is formed of a single layer formed of aluminum (Al) or an aluminum alloy such as aluminum-neodymium (Al—Nd), or a stacked layer formed of an Al alloy on a chromium (Cr) or molybdenum (Mo) alloy.

A gate electrode 328 is formed in a predetermined region corresponding to the semiconductor layer 320 by etching the metal layer for a gate electrode. The predetermined region corresponds to a channel region 324 to be formed in subsequent processes.

Then, source and drain regions 322 are formed by doping a conductive impurity using the gate electrode 328 as a mask. A region that is not doped with the impurity and located between the source and drain regions 322 is a channel region 324. Alternatively, the doping process may be performed by forming a photoresist before the formation of the gate electrode 328. Also, although the process of forming the gate electrode after the formation of the semiconductor layer according to aspects of the present invention is described, a process of forming the gate electrode under the semiconductor layer before formation of the semiconductor layer may be performed.

Subsequently, an interlayer dielectric layer 340 is formed on the substrate 300 comprising the gate electrode 328, and contact holes 342 are formed to pass through the interlayer dielectric layer 340 and the gate insulating layer 330 and to partially expose the source and drain regions 322. A conductive material is deposited on the substrate 300 comprising the contact holes 342 and then patterned, thereby forming source and drain electrodes 352, which are connected to the source and drain regions 322 through the contact holes 342. The thin film transistor may be formed in a top-gate type or bottom-gate type.

Figure 4:
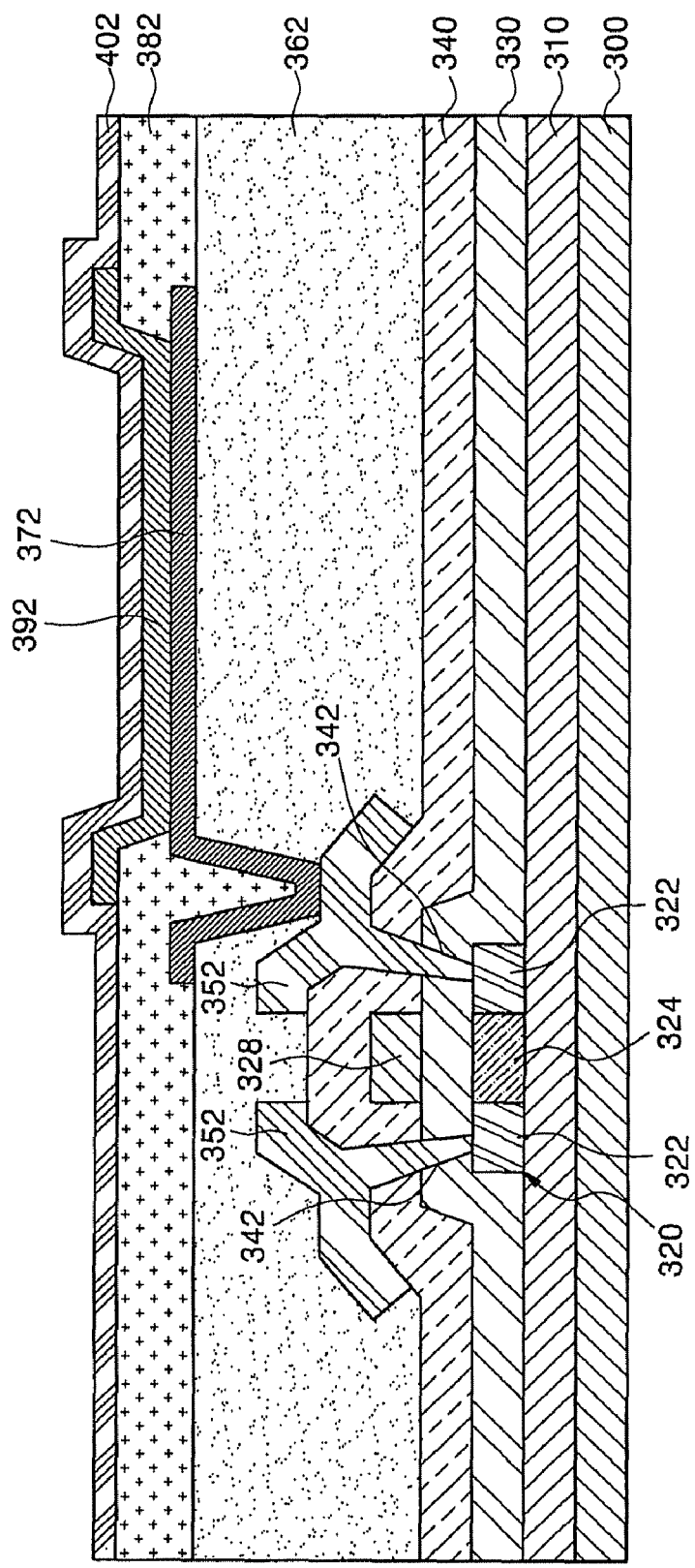
FIG. 4 illustrates an organic light emitting diode (OLED) display device according to aspects of the present invention.

FIG. 4 illustrates an organic light emitting diode (OLED) display device according to a secondary exemplary embodiment of the present invention. In this embodiment, the thin film transistor formed in the first exemplary embodiment is included, so the description of the process of fabricating the thin film transistor is omitted. Referring to FIG. 4, after forming the thin film transistor as in the first exemplary embodiment, a passivation layer 362 is formed on the entire surface of the substrate having the source and drain electrodes 352. Then, a hole (not illustrated) is formed in the passivation layer 362 through which a first electrode 372 contacts one of the source and drain electrodes 352, and a pixel defining layer 382 which defines a pixel region is formed on the substrate 300 to form an opening in the first electrode 372.

Then, an organic emitting layer 392 is formed on the first electrode 372 in the opening of the pixel defining layer 382, and a second electrode 402 is formed on the surface of the substrate to complete the OLED display device.

Figure 5:
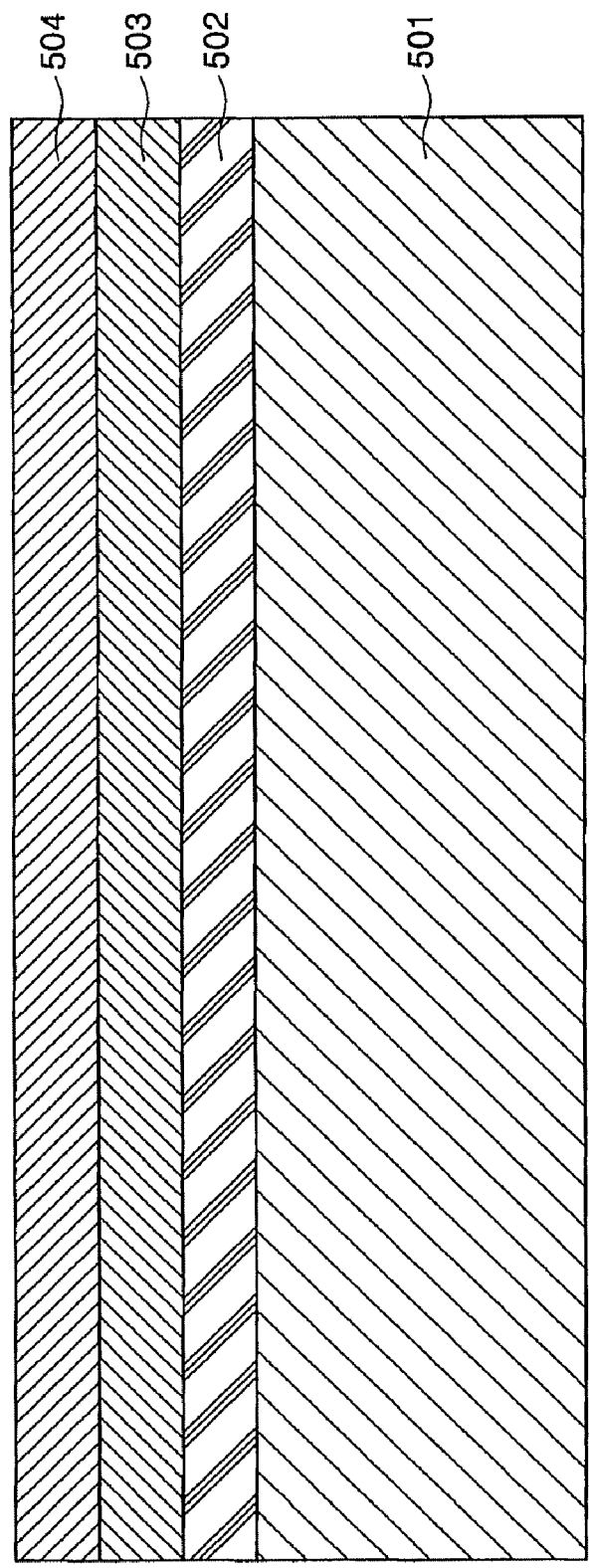

FIGS. 5 to 10B are plan and cross-sectional views illustrating a method manufacturing a flat panel display device according to aspects of the present invention. Although an organic light emitting diode display device is described, aspects of the present invention are not limited thereto such that a liquid crystal display device could be used. First, FIG. 5 is a cross-sectional view illustrating a process of sequentially forming a buffer layer 502, an amorphous silicon layer 503, and a capping layer 504 on a substrate 501. As shown in FIG. 5, the buffer layer 502 is formed on the substrate 501, which is formed of plastic or glass, the amorphous silicon layer 503 is formed on the buffer layer 502, and the capping layer 504 is formed thereon. Here, the buffer layer 502 serves as a passivation layer to protect the substrate 501 and devices to be formed later, and to protect the substrate 501 from heat generated during crystallization.

Figure 6A:
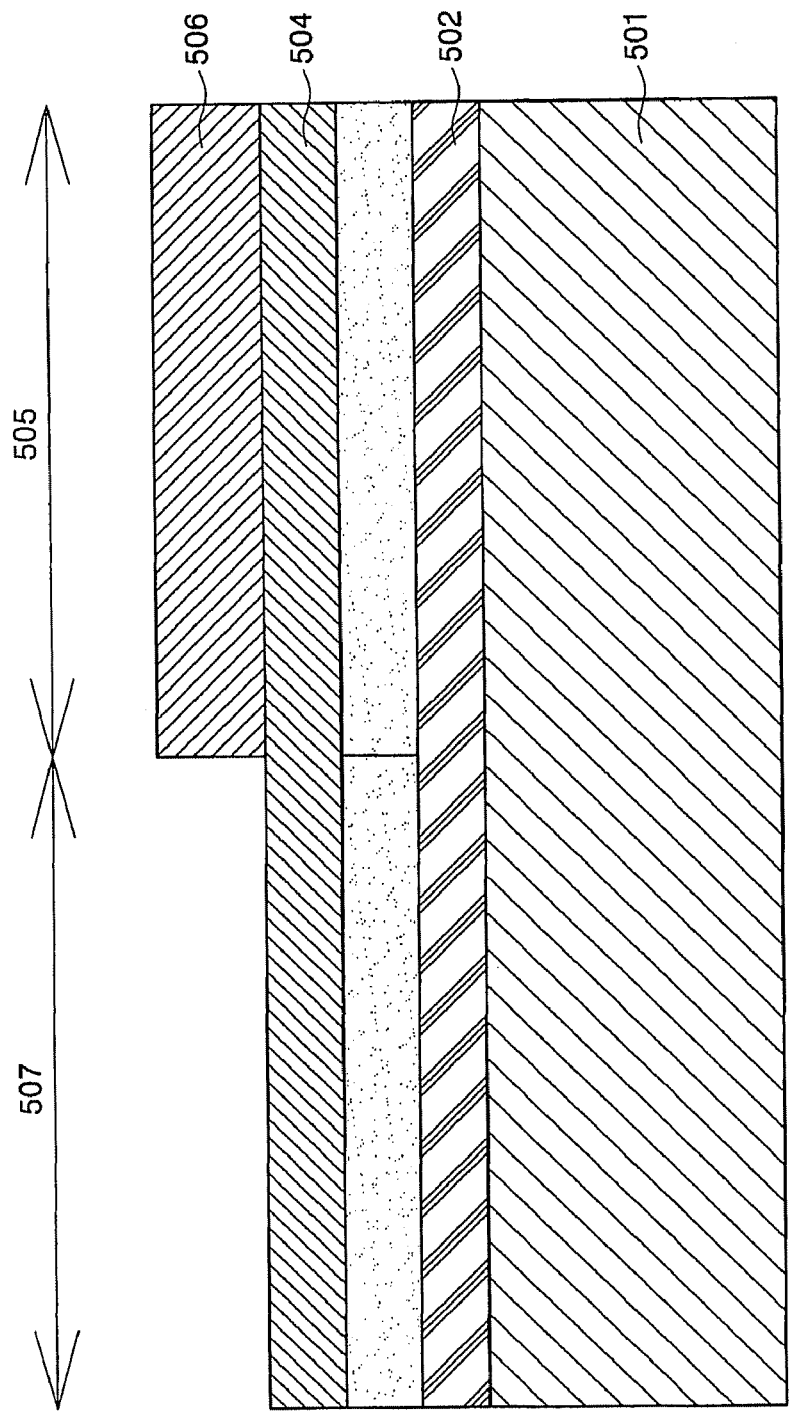
Figure 6B:
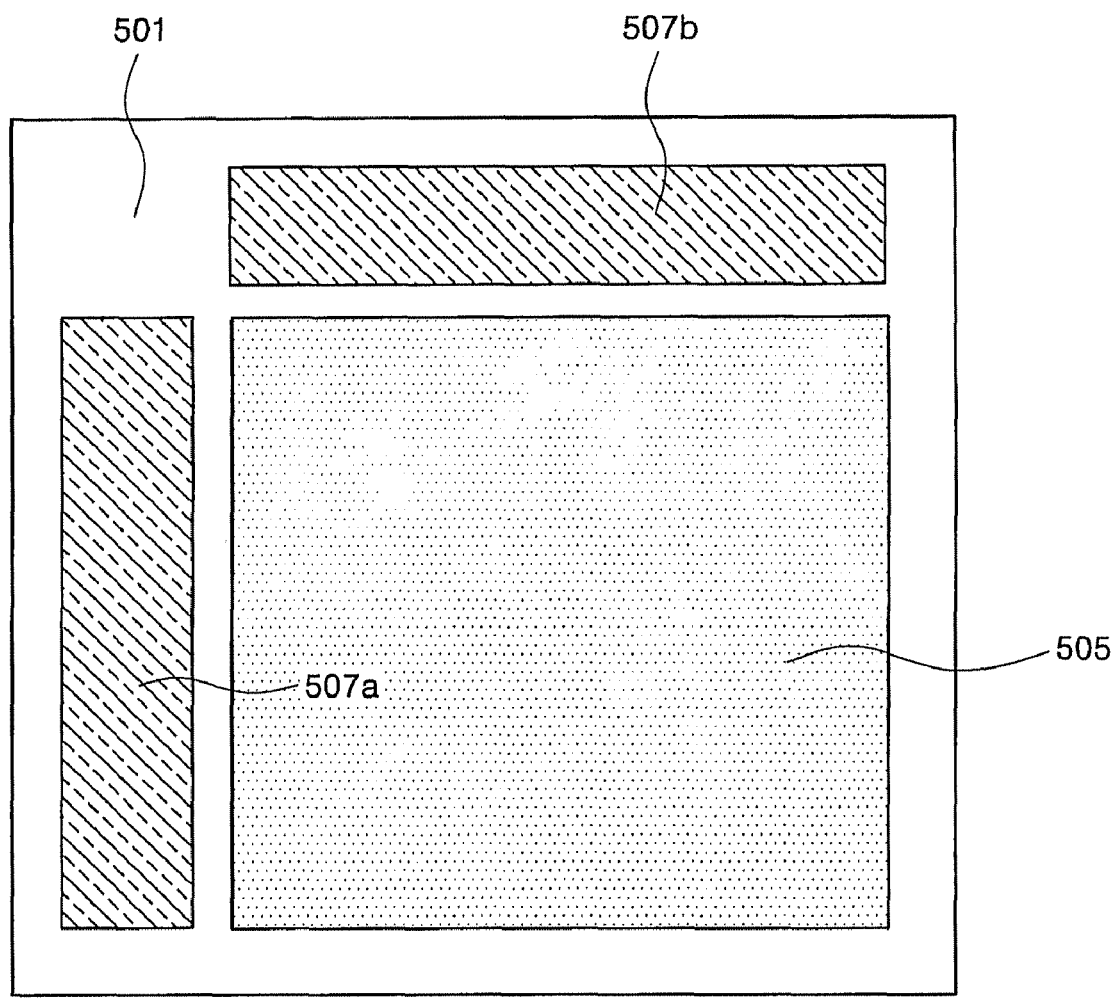

FIGS. 6A and 6B are cross-sectional and plan views illustrating a process of forming a metal catalyst layer on the capping layer 504, and patterning the metal catalyst layer to remove the metal catalyst layer in a peripheral region 507 and leave the patterned metal catalyst layer 506 in a pixel region 505. As shown in FIGS. 6A and 6B, a metal catalyst layer is formed on the entire surface of the substrate 501, and the patterned metal catalyst layer 506 remains only on the pixel region 505 using a photoresist pattern, and the metal catalyst layer on the peripheral region 507, which includes a data line driving circuit part 507a and a scan line driving circuit part 507b, is removed. Here, in a region excluding the pixel and peripheral regions of the substrate, the amorphous silicon layer 503 and the metal catalyst layer may remain but are preferably removed.

Here, the metal catalyst layer may be formed by depositing at least one of Ni (nickel), Pd (palladium), Ti (titanium), Ag (silver), Au (gold), Al (aluminum), Sn (tin), Sb (antimony), Cu (copper), Co (cobalt), Mo (molybdenum), Tb (terbium), Ru (ruthenium), Rh (rhodium), Cd (cadmium) and Pt (platinum), and preferably Ni. Also, the metal catalyst layer has a thickness of 200 Å or more to be uniformly formed, and has a thickness of approximately 1000 Å to sufficiently transfer metal catalyst particles to the amorphous silicon layer 503 in the pixel region 505; and thus, the metal catalyst layer is formed to a thickness of 200 to 1000 Å.

FIG. 7 is a cross-sectional view illustrating a process of crystallizing the peripheral region 507 by thin beam directional crystallization using a laser on the substrate 501 and diffusing the metal catalyst particles 510 from the patterned metal catalyst layer 506 in the pixel region 505 into the capping layer 504. Here, the laser 508 is irradiated on the substrate, as illustrated in FIG. 7, to crystallize the amorphous silicon layer in the peripheral region 507 into a polycrystalline silicon layer 509 by thin beam directional crystallization according to aspects of the present invention, which results in the polycrystalline silicon layer 509 having excellent electron mobility. The thin beam directional crystallization method is a method of directly irradiating a laser beam on the amorphous silicon layer 503 without using a mask. Here, the laser beam has a length of 356 to 1100 nm and a width of 5 to 20 µm in order to melt and solidify the amorphous silicon, and the laser is irradiated at a complete melting region energy or near the complete melting region energy so as to instantly melt amorphous silicon. Preferably, the laser beam has an energy density of 150 to 1000 mJ/cm$^2$ and has an intensity sufficient to melt the amorphous silicon.

Also, in order to remove a primary grain boundary formed by a volume difference during melting and solidification of the amorphous silicon layer, a pitch is designed to be 1 to 3 µm. The irradiated laser beam has a width of 5 to 20 µm and is continuously irradiated while moving at a pitch of at least 3 µm or less in a direction perpendicular to the length of the laser beam so as to remove a primary grain boundary perpendicular to the direction of crystal growth, which interrupts electrical flow. The polycrystalline silicon layer may be formed to have a surface roughness of 2 to 4 µm.

As described above, by using the thin beam directional crystallization method, the primary grain boundary generated when the amorphous silicon layer is melted and solidified may be removed, and a device having excellent characteristics may be formed due to the lack of primary grain boundaries and the good surface roughness. Further, as the mask is not used, the process is simpler and more economical.

While the peripheral region 507 is crystallized by the thin beam directional crystallization method, the pixel region 505 is crystallized by diffusion of the metal catalyst particles 510 through the capping layer 504. Here, as in the polycrystalline silicon layer in the pixel region 505, the metal catalyst particles 510 diffuse through the capping layer 504, thereby inducing the crystallization of the amorphous silicon layer by super grain silicon (SGS) crystallization. In the pixel region 505 crystallized by the SGS crystallization, the metal catalyst particles 510 diffuse into or are adsorbed into the capping layer 504 due to the laser used in the thin beam directional crystallization such that a small amount of the metal catalyst particles 510 remains in the capping layer 504.

The capping layer 504 containing the metal catalyst particles 510 is annealed to crystallize the amorphous silicon layer using the metal catalyst particles 510 as seeds. By SGS crystallization, the amount of the metal catalysts remaining in the capping layer 504 is reduced to $10^9$ to $10^{13}$ atoms/cm$^3$ such that the resulting polycrystalline layer 511 has a concentration of metal catalyst particles 510 $10^{13}$ atoms/cm$^3$ or less. Also, the grain formed by the SGS crystallization has excellent uniformity, and thus the device using the grain formed by the SGS crystallization has excellent characteristics.

Figure 8:
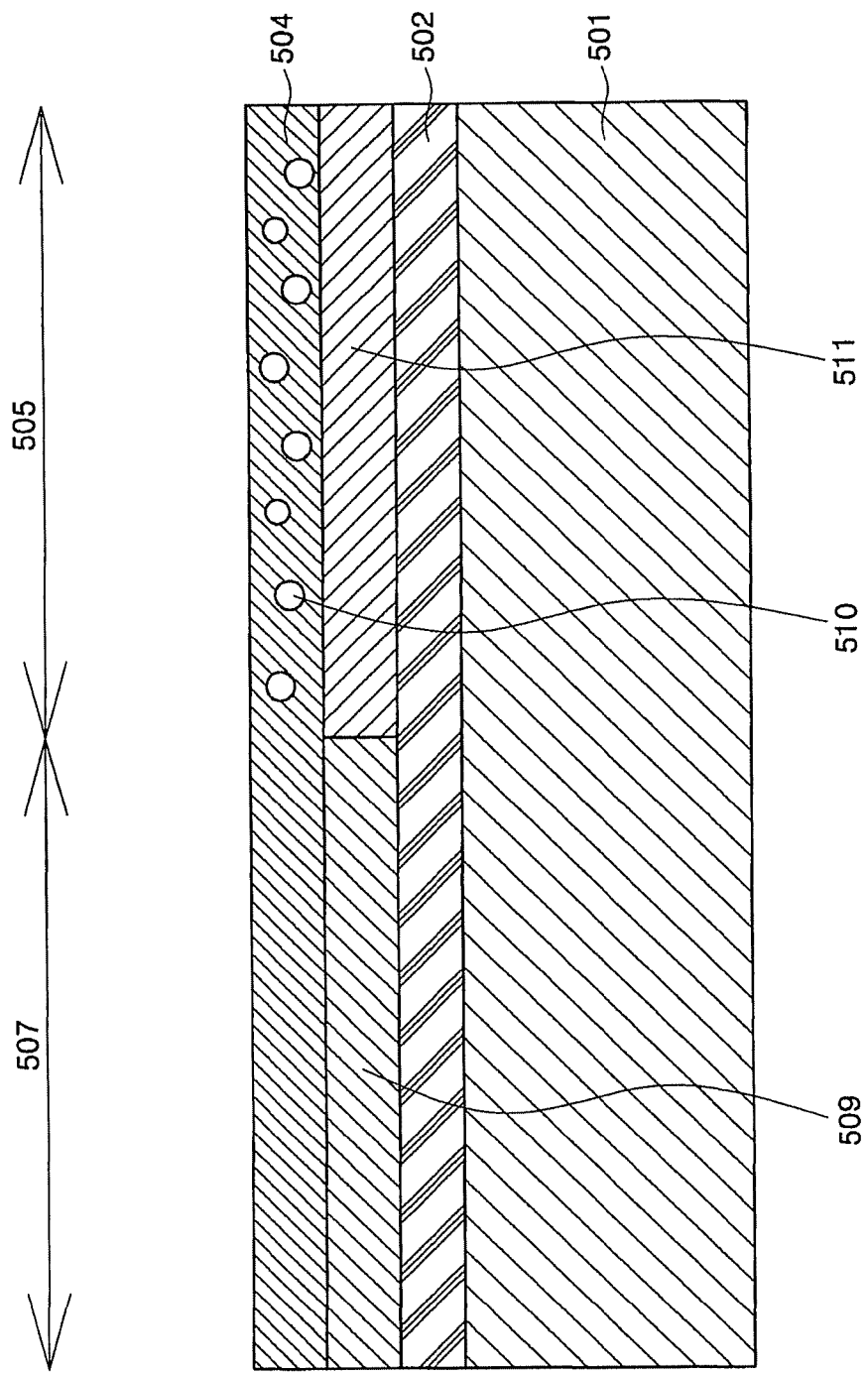

FIG. 8 is a cross-sectional view illustrating a process of removing the patterned metal catalyst layer 506, annealing the substrate and crystallizing the amorphous silicon layer in the pixel region 505 into the polycrystalline silicon layer 511. As illustrated in FIG. 8, the patterned metal catalyst layer 506 remaining after diffusion of the metal catalyst particles 510 into the capping layer 504 is removed, and the substrate 501 is annealed, thereby inducing the crystallization of the amorphous silicon layer in the pixel region 505 due to the metal catalyst particles 510 diffusing into or being adsorbed into the capping layer 504, and thus the polycrystalline silicon layer 511 crystallized by the SGS crystallization is formed. Here, the annealing process is performed by a furnace annealing or rapid thermal annealing (RTA) method.

FIG. 9 is a cross-sectional view illustrating a process of removing the capping layer 504, forming a polycrystalline silicon layer 511 by the SGS crystallization in the pixel region 505, and forming a polycrystalline silicon layer 509 by the thin beam directional crystallization in the peripheral region 507. As illustrated in FIG. 9, the capping layer 504 is removed, and the polycrystalline silicon layer 511 is formed by the SGS crystallization in the pixel region 505, and the polycrystalline silicon layer 509 is formed by the thin beam directional crystallization in the peripheral region 507.

Figure 10A:
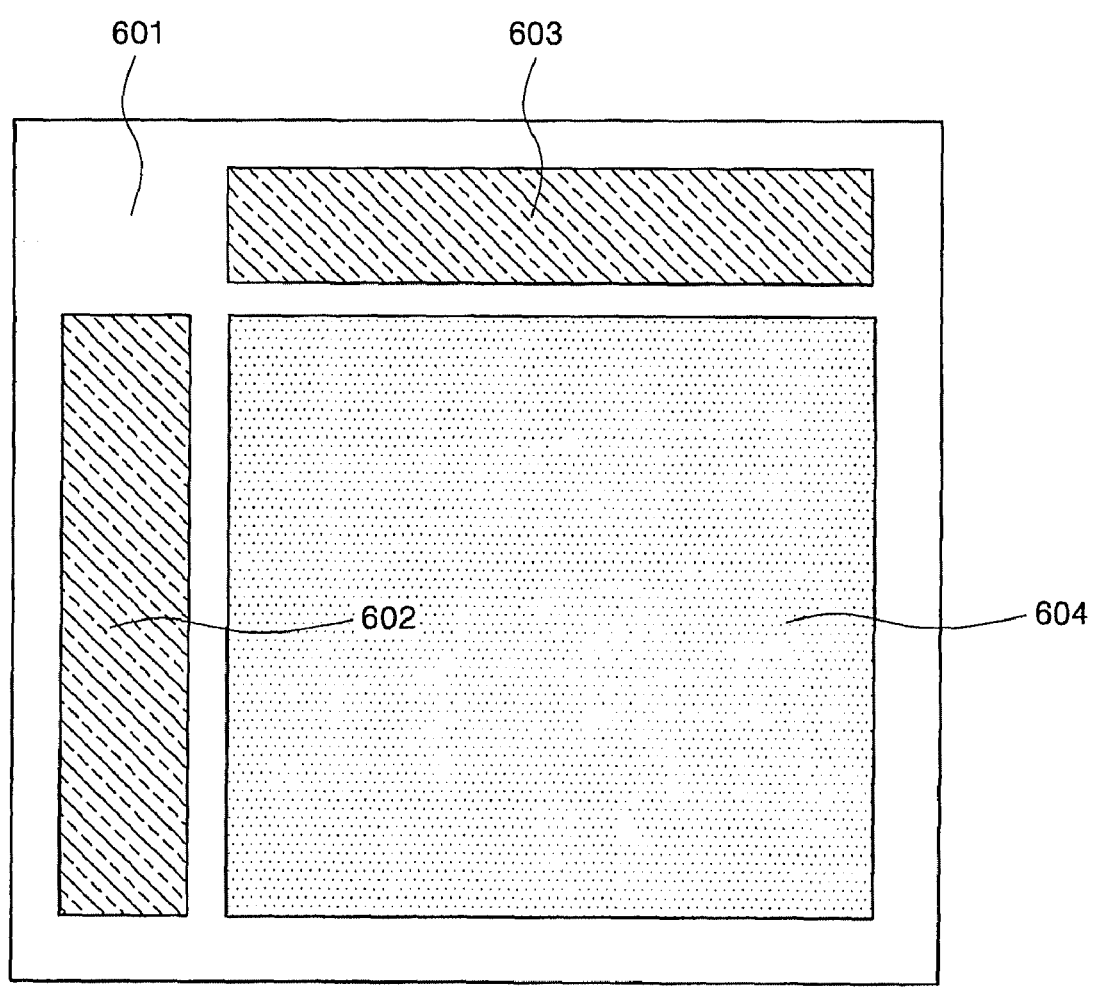
Figure 10B:
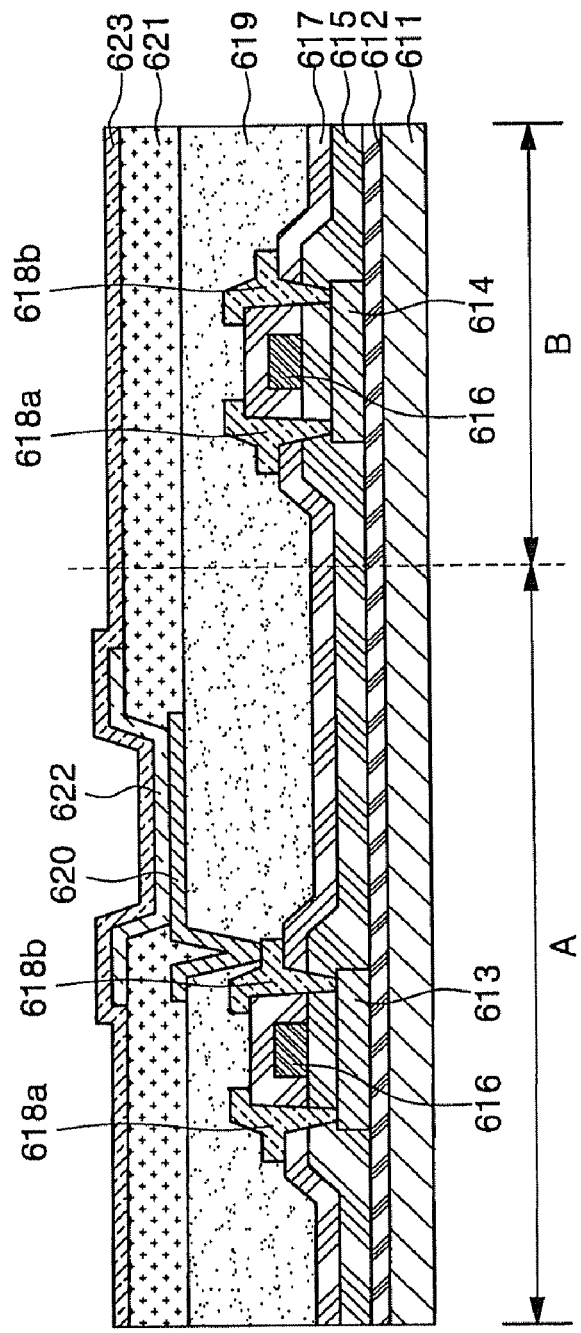

FIGS. 10A and 10B are respectively a plan view and a cross-sectional view of a flat panel display device completed by forming a pixel part of the flat panel display device in a pixel region and forming a scan line driving circuit and a data line driving circuit in a peripheral region using the crystallized polycrystalline silicon layer. Referring to FIG. 10A, a peripheral region is formed, which includes a scan line driving circuit part 602 and a data line driving circuit part 603, using a polycrystalline silicon layer crystallized by the thin beam directional crystallization on a transparent substrate 601 formed of plastic or glass, and a thin film transistor in a pixel region 604 is formed using a polycrystalline silicon layer crystallized by the SGS crystallization.

Referring to FIG. 10B, an amorphous silicon layer in the pixel region A is crystallized into polycrystalline silicon layer by the SGS crystallization and an amorphous silicon layer in the peripheral region B on the substrate 611 is crystallized into polycrystalline silicon layer by the thin beam directional crystallization. Then, the crystallized polycrystalline silicon layers are patterned to respectively form a semiconductor layer 613 in the pixel region A and a semiconductor layers 614 in the peripheral region B. A gate insulating layer 615 is formed on the entire surface of the substrate 611, and gate electrodes 616 are formed on the gate insulating layer 615 corresponding to the semiconductor layers 613 and 614. Source and drain regions (not shown) are formed by doping a conductive impurity using the gate electrodes 616 as a mask. A region that is not doped with the impurity and located between the source and drain regions is a channel region (not shown). Alternatively, the doping process may be performed by forming a photoresist before the formation of the gate electrodes 616. After that, an interlayer insulating layer 617 is formed on the entire surface of the substrate, and source and drain electrodes 618a and 618b are formed on the interlayer insulating layer 617 and connected to the gate electrodes 616 so that a thin film transistor in the pixel region A and a thin film transistor in the peripheral region B are completed.

Subsequently, a passivation layer 619 is formed over the thin film transistors in the pixel region A, and a first electrode 620 is connected with one of the source and drain electrodes 618a and 618b. A pixel defining layer 621 is formed on the passivation layer 619 and has an opening to expose the first electrode 620. An organic emitting layer 622 is formed in the opening of the pixel defining layer 621 on the first electrode 620, and a second electrode 623 is formed on the surface of the substrate 611, thereby forming a pixel in the pixel region so that the flat panel display device is completed. As shown in FIG. 10B, the passivation layer 619 may be formed to cover the thin film transistor in the peripheral region B, but aspects of the present invention are not limited thereto. Further, a buffer layer 612 may be formed on the substrate to prevent diffusion of impurities and protect the substrate from heat used during crystallization.

Figure 11A:
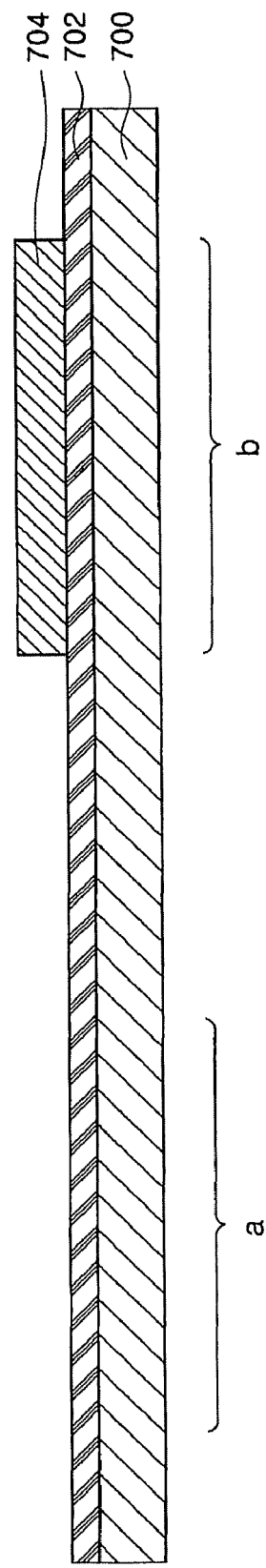
FIGS. 11A to 11D illustrate a semiconductor device according to aspects of the present invention.

FIGS. 11A to 11D illustrate a semiconductor device according to aspects of the present invention. Referring to FIG. 11A, a buffer layer 702 is formed on a substrate 700. The substrate 700 may be an insulating substrate, for example, a glass substrate. The buffer layer 702 may be formed of silicon oxide or silicon nitride, and then an amorphous silicon layer is formed thereon. The amorphous silicon layer is formed to a thickness of 100 to 500 Å, and patterned to form a photodiode electrode 704 in a photodiode region b.

The semiconductor device has a thin film transistor region a and the photodiode region b. According to aspects of the present invention, the thin beam directional crystallization method may be used to crystallize an amorphous silicon layer into a polycrystalline layer to form a semiconductor layer in the thin film transistor region a and an intrinsic region of a semiconductor layer in the photodiode region b. However, aspects of the present invention are not limited thereto, and the semiconductor layer in the thin film transistor region a may be crystallized by SGS crystallization, and the intrinsic region of the semiconductor layer in the photodiode region b may be crystallized by thin beam directional crystallization. Further, the semiconductor layer in the thin film transistor region a may be crystallized by thin beam directional crystallization, and the intrinsic region of the semiconductor layer in the photodiode region b may be crystallized by SGS crystallization.

Figure 11B:
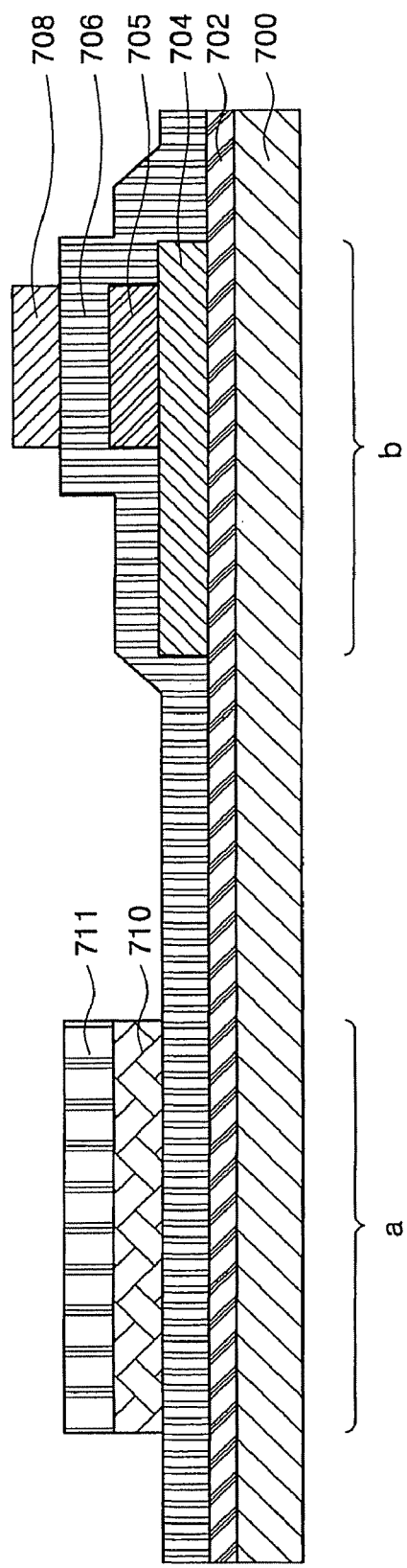

Then, referring to FIG. 11B, a 200 Å thick amorphous silicon layer is further formed on the photodiode electrode 704 and doped with an n-type metal. After that, the doped amorphous silicon layer is patterned so as to form an n-type silicon layer 705. The n-type metals may be at least one of antimony (Sb), arsenic (As), and phosphorus (P).

An amorphous silicon layer 706 is formed to a thickness of 500 to 1500 Å on the entire surface of the substrate 700 by PECVD or LPCVD. Then, a capping layer is formed on the entire surface of the amorphous silicon layer 706, and a metal catalyst layer is formed thereon. The metal catalyst layer and the capping layer are patterned so as to form a patterned metal catalyst layer 711 on the patterned capping layer 710 in the thin film transistor region a.

The metal catalyst layer may be formed by depositing at least one metal of Ni, Pd, Ti, Ag, Au, Al, Sn, Sb, Cu, Co, Mo, Tb, Ru, Rh, Cd, and Pt, and preferably Ni. Also, the metal catalyst layer may have a thickness of 200 Å or more so as to be uniformly formed, and may have a thickness of 1000 Å or less so as to sufficiently to transfer metal catalyst particles to the amorphous silicon layer 706 in the thin film transistor region a. Thus, the thickness of the metal catalyst layer may be from 200 to 1000 Å.

Subsequently, the photodiode region is crystallized using the thin beam directional crystallization according to aspects of the present invention, and metal catalyst particles diffuse into the patterned capping layer 710. Here, to diffuse the metal catalyst particles from the patterned metal catalyst layer 711, the laser beam used in the thin beam direction crystallization can be applied. The laser beam may have a length d1 of 365 to 1100 nm and a width d2 of 5 to 20 μm so as to melt and solidify the amorphous silicon layer. The laser beam be at a complete melting region energy or near the complete melting region energy of the amorphous silicon. Preferably, the laser beam has an energy density of 150 to 1000 mJ/cm$^2$ and enough intensity to completely melt the amorphous silicon. Also, in order to remove a primary grain boundary formed by a volume difference generated when the amorphous silicon layer is melted and solidified, a pitch d3 is designed to be 1 to 3 μm. As the irradiated laser beam has a width d2 of 5 to 20 μm, the laser is continuously irradiated while moving in a direction perpendicular to the length d1 at a pitch d3 of at least 3 μm or less so as to remove the primary grain boundary which interrupts the electrical flow. Using this laser, a polycrystalline silicon layer having a surface roughness of 15 nm or less may also be formed.

After that, the patterned metal catalyst layer 711 is removed, and the substrate 700 is annealed to induce the crystallization of the amorphous silicon layer 706 in the thin film transistor region a corresponding to the patterned capping layer 710, and thus a polycrystalline silicon layer crystallized by the SGS crystallization is formed in the thin film transistor region a.

When fabricating a device having different characteristics in different regions thereof as described above, the thin beam directional crystallization produces an excellent device having lower roughness, large grains, and no primary grain boundaries. Also, since the thin beam directional crystallization does not need a mask, it is possible to reduce process time and production costs. Further, since the SGS crystallization can form grains having good uniformity, when the two methods are used to form a device having different characteristics in different regions, it is possible to make a device having excellent characteristics throughout.

Another amorphous silicon layer is formed at a thickness of about 200 Å on the amorphous silicon layer 706 and doped with a p-type metal. The other amorphous silicon layer is patterned to form a p-type silicon layer 708 corresponding to the n-type silicon layer 705 in the photodiode region. The p-type metals may be at least one of indium (In) and gallium (Ga).

Figure 11C:
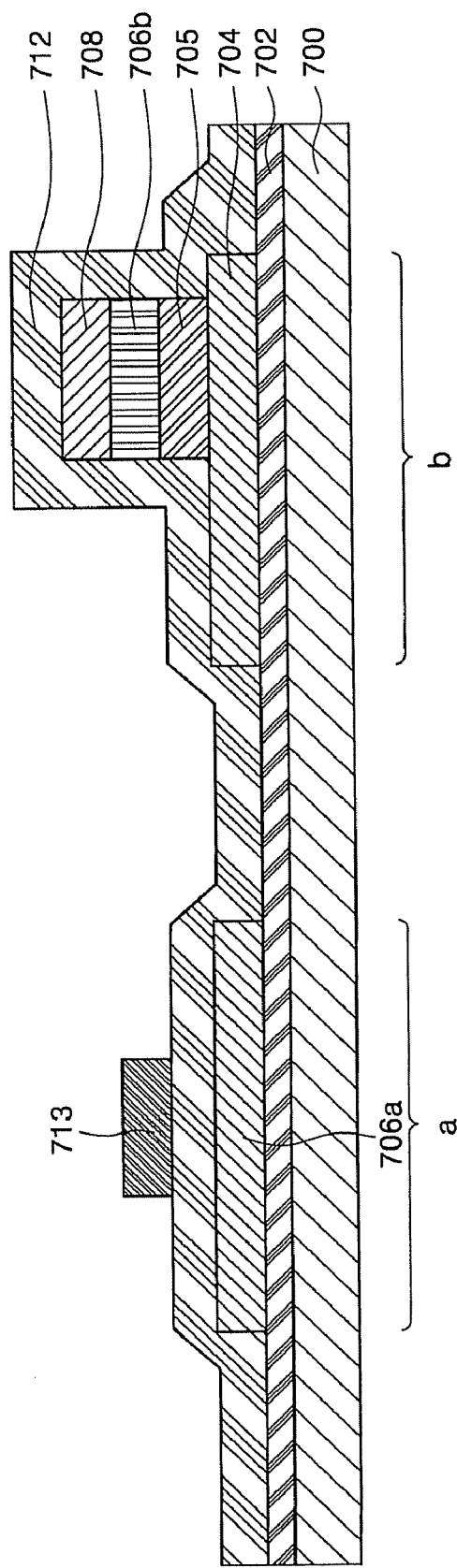

Referring to FIG. 11C, the crystallized amorphous silicon layer 706 is patterned so as to form a photodiode having an intrinsic region 706b and a semiconductor layer 706a of a thin film transistor. Agate insulating layer 712 is formed to a thickness of 1000 Å on the entire surface of the substrate using an insulating material, such as silicon oxide or silicon nitride. A gate electrode 713 is formed on the gate insulating layer 712 corresponding to the semiconductor layer 706a of the thin film transistor. Source and drain regions (not shown) are formed by doping a conductive impurity using the gate electrode 713 as a mask. A region that is not doped with the impurity and located between the source and drain regions is a channel region (not shown). Alternatively, the doping process may be performed by forming a photoresist before the formation of the gate electrode 713.

Figure 11D:
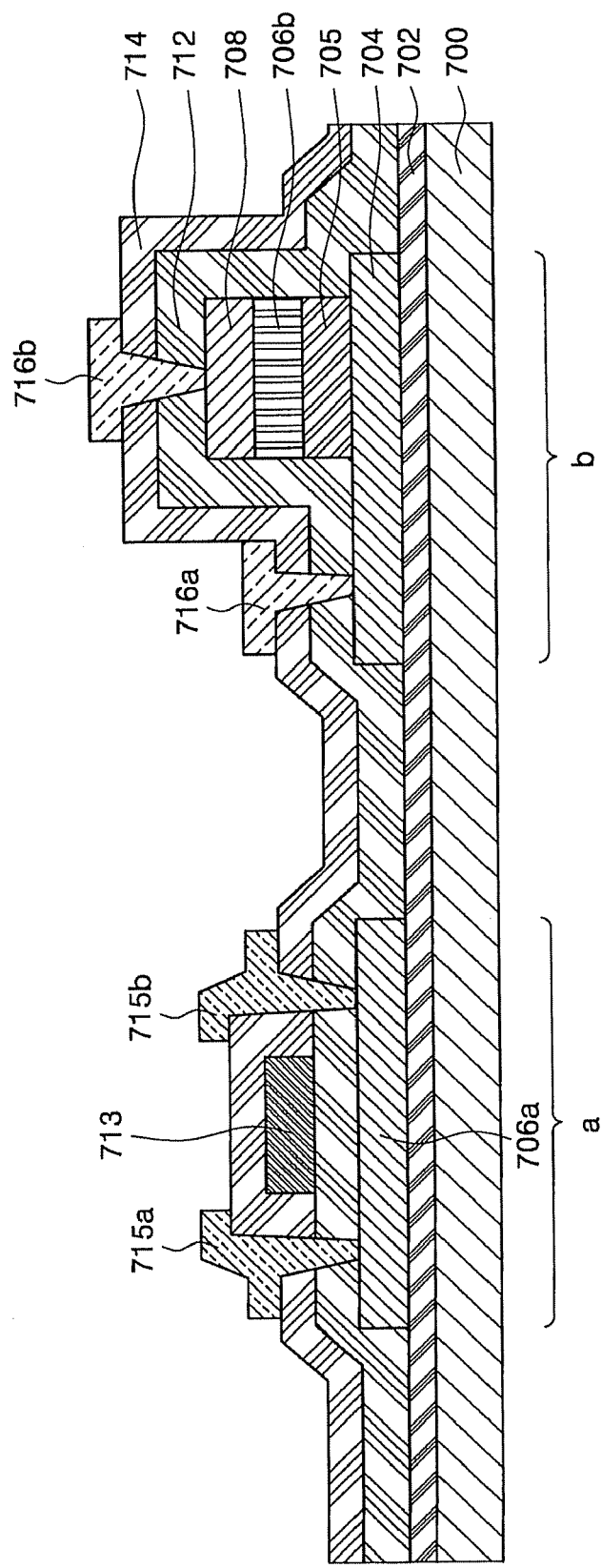

Then, referring to FIG. 11D, an interlayer insulating layer 714 is formed on the entire surface of the substrate. The interlayer insulating layer 714 may be formed to a thickness of 6000 to 8000 Å.

Source and drain electrodes 715a and 715b are formed to contact the semiconductor layer 706a. Interconnections 716a and 716b are formed to contact the p-type silicon layer 708 and the photodiode electrode 704. The source and drain electrodes 715a and 715b are connected to the semiconductor layer 706a by removing corresponding portions of the gate insulating layer 712 and the interlayer insulating layer 714. And, the interconnections 716a and 716b connect the p-type silicon layer 708 and the photodiode electrode 704 by removing corresponding portions of the gate insulating layer 712 and the interlayer insulating layer 714. Finally, the semiconductor device comprising the thin film transistor region a and the photodiode region b according to aspects of the present invention is completed.

According to aspects of the present invention, by using a thin beam directional crystallization method, excellent polycrystalline silicon having no primary grain boundary and low surface roughness can be formed. Also, since this method does not use a mask during laser irradiation, a device can be fabricated by a simple process and at low cost. Consequently, a flat panel display device and a semiconductor device, which have excellent characteristics, can be fabricated. Further, when fabricating a device having different characteristics throughout, SGS crystallization and thin beam directional crystallization can be applied to different regions, thereby increasing efficiency of the device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
   a substrate;
   a semiconductor layer formed of polycrystalline silicon on the substrate, the semiconductor layer having a variation in height of a top surface of 15 nm or less,
      wherein all of the grain boundaries of the semiconductor layer extend in a single crystal growth direction;
   a gate electrode formed to correspond to a part of the semiconductor layer;
   a gate insulating layer to insulate the gate electrode from the semiconductor layer; and
   source and drain electrodes connected to the semiconductor layer.

2. The thin film transistor of claim 1, wherein grain boundaries extend in a direction of current flow in the semiconductor layer.

3. An organic light emitting diode (OLED) display device, comprising:
   a substrate;
   a semiconductor layer formed of polycrystalline silicon disposed on the substrate, the semiconductor layer having a variation in height of a top surface of 15 nm or less,
      wherein all of the grain boundaries of the semiconductor layer-extend in a single crystal growth direction;
   a gate electrode formed to correspond to a part of the semiconductor layer;
   a gate insulating layer to insulate the semiconductor layer from the gate electrode;
   source and drain electrodes connected to the semiconductor layer;
   a first electrode connected to one of the source and drain electrodes;
   an organic emitting layer disposed on the first electrode; and
   a second electrode disposed on the organic emitting layer.

4. The OLED display device of claim 3, wherein the grain boundaries extend in a direction of current flow in the semiconductor layer.

5. A flat panel display device, comprising:
   a substrate having a pixel region and a peripheral region;
   a first polycrystalline silicon layer disposed on the substrate in the pixel region, the first polycrystalline silicon layer including metal catalyst particles at a concentration of $10^{13}$ atoms/cm$^3$ or less;
   a second polycrystalline silicon layer disposed on the substrate in the peripheral region, the second polycrystalline silicon layer having a grain boundary disposed in a crystal growth direction and having a variation of height in a top surface of 15 nm or less;
   gate electrodes formed to respectively correspond to parts of the first and second polycrystalline silicon layers;
   a gate insulating layer to insulate the first and second polycrystalline silicon layers from the gate electrodes; and
   source and drain electrodes respectively connected to parts of the first and second polycrystalline silicon layers;
   a first electrode connected to one of the source and drain electrodes connected to the first polycrystalline silicon layer in the pixel region; and
   an electrode of a display electrically connected to one of the source or drain electrodes.

6. The device of claim 5, wherein the polycrystalline silicon layer in the pixel region comprises metal catalyst particles at a concentration of $10^9$ to $10^{13}$ atoms/cm$^3$.

7. A semiconductor device, comprising:
   a substrate having a thin film transistor region and a photodiode region;
   a first semiconductor layer disposed on the substrate in the thin film transistor region, and the first semiconductor layer having metal catalyst particles at a concentration of $10^{13}$ atoms/cm$^3$ or less; and
   a second semiconductor layer disposed on the substrate in the photodiode region, the second semiconductor layer having a grain boundary disposed in a crystal growth direction and having a variation in height of a top surface of 15 nm or less;
   a gate insulating layer, a gate electrode, an interlayer insulating layer formed on the first semiconductor layer, and source and drain electrodes connected to the first semiconductor layer;
   an n-type silicon layer, an intrinsic region, and a p-type silicon layer formed on the second semiconductor layer, and interconnections connected to the second semiconductor layer and the p-type silicon layer.

8. The device of claim 7, wherein the first semiconductor layer comprises metal catalyst particles at a concentration of $10^9$ to $10^{13}$ atoms/cm$^3$.

* * * * *